United States Patent [19]

Köhl et al.

[11] 4,428,795

[45] Jan. 31, 1984

[54] PROCESS FOR POLISHING INDIUM PHOSPHIDE SURFACES

[75] Inventors: Franz Köhl; Anton Schnegg, both of Burghausen, Fed. Rep. of Germany; Karl Lener, Handenberg, Austria

[73] Assignee: Wacker-Chemitronic Gesellschaft fur Electronik-Grundstoffe mbH, Burghausen, Fed. Rep. of Germany

[21] Appl. No.: 504,577

[22] Filed: Jun. 15, 1983

[30] Foreign Application Priority Data

Jun. 18, 1982 [DE] Fed. Rep. of Germany ....... 3222790

[51] Int. Cl.$^3$ ............ H01L 21/306; B44C 1/22; C03C 15/00; C03C 25/06
[52] U.S. Cl. ............ 156/636; 156/654; 156/662; 252/79.3; 252/79.4
[58] Field of Search ............ 252/79.1, 79.2, 79.3, 252/79.4, 79.5; 156/636, 654, 662, 645

[56] References Cited

U.S. PATENT DOCUMENTS 3,738,882  6/1973  Basi ................................. 156/636
3,979,239  9/1976  Walsh ............................... 156/636

FOREIGN PATENT DOCUMENTS 1025177  4/1966  United Kingdom .............. 156/662

OTHER PUBLICATIONS

Japanese Journal of Applied Physics, vol. 19, No. 1, Jan., 1980, pp. 79-85, Chemical Etching of INP and GaIn AsP for Fabricating Laser Diodes and Integrated Optical Circuits, Toshio Kambayash et al.

*Primary Examiner*—William A. Powell
*Attorney, Agent, or Firm*—Allison C. Collard; Thomas M. Galgano

[57] ABSTRACT

Indium phosphide surfaces can be polished if, during the mechanical polishing operation, which is carried out in a customary manner, a component that yields free chlorine in an aqueous acidic medium, and, at the same time, a component that yields free carbon dioxide are applied to the surface to be polished.

5 Claims, No Drawings

PROCESS FOR POLISHING INDIUM PHOSPHIDE SURFACES

The invention relates to a process for polishing indium phosphide surfaces.

As miniaturization in the field of electronic components increases, there is also an increase in the demands made on the surface quality of the semiconductor wafers from which such components are manufactured. This has resulted, for example, in the case of silicon, germanium and gallium phosphide wafers, in the development of efficient polishing processes that are distinguished by high abrasion rates, high surface quality and favorable operator conditions. In contrast thereto, the processes currently used for polishing indium phosphide surfaces are not satisfactory.

For example, in the processes according to DE-OS No. 25 58 929 and DE-OS No. 26 00 990, in which acidic and alkaline, respectively, alkali metal hypochlorite solutions are used, the abrasion rate during polishing is only poor, although those processes produce very good results especially in the case of gallium phosphide. Improved abrasion rates can be obtained according to DE-AS No. 15 46 063 by polishing in the presence of bromine/methanol mixtures. However, such mixtures have a strong corrosive action on the polishing apparatus, and are extremely unpleasant to handle.

The object of the invention is, therefore, to provide a process that enables indium phosphide surfaces to be polished with high abrasion rates but without the above-mentioned disadvantages.

This object is achieved by a process which is characterized in that, during the mechanical polishing operation, an oxidizing component that yields free chlorine in an aqueous acidic medium and a component that yields free carbon dioxide are applied to the surface to be polished.

Alkali metal hypochlorites are preferably used as the oxidizing components that yield free chlorine in an aqueous acidic medium. These are especially advantageously available, for example, in the form of commercially available bleaching liquor, an aqueous solution that contains sodium hypochlorite and is obtained by the action of chlorine on sodium hydroxide solution. Also suitable are "Eau de Javelle", an aqueous solution of potassium hypochlorite that can be obtained by the action of chlorine on potassium hydroxide solution, and solutions of lithium hypochlorite. There also come into consideration substances such as, for example, chloramine-T, which behave like hypochlorous acid in aqueous solution, and other chlorine-containing substances, such as, for example, various chlorinated cyanuric acids, which are able to form free chlorine in acidic aqueous solution.

Mixtures of carbonates and acids, such as, for example, sodium or potassium carbonate with phosphoric or hydrochloric acid may, for example, be used as the components that yield free carbon dioxide. However, with a view to more uniform, and not too rapid, evolution of carbon dioxide, it has proved more advantageous to use organic compounds that are attacked by the oxidizing component that yields free chlorine, with the formation of carbon dioxide. Especially suitable for this purpose are aqueous solutions of organic carboxylic acids that can be oxidized to form carbon dioxide, since such solutions act simultaneously as the necessary aqueous acidic medium and as the compound that yields carbon dioxide. In this connection, hydroxycarboxylic acids, such as lactic, gluconic and glyceric acids, dicarboxylic acids, such as oxalic, malonic, succinic, maleic and fumaric acids, hydroxydicarboxylic acids, such as tartaric, malic acids and hydroxytricarboxylic acids such as citric acid, keto acids, such as glyoxylic and pyruvic acids, and even polymeric hydroxy or aldehydo acids and their oxidative precursors, such as, for example, hydroxyaldehydes, have proved to be suitable.

In the customary form of process, the components to be added during the mechanical polishing operation are made ready in separate supply vessels and are conveyed by way of separate supply lines, for example, flexible-tube systems equipped with hose pumps, to the polishing machine where they are combined directly in the polishing operation on the polishing cloth. The suitable inflow quantity is generally approximately from 10 to 100 ml/min per approximately 100 $cm^2$ of indium phosphide surface to be polished, it being advantageous to aim at an almost uniform inflow speed of the individual components.

Suitable mechanical polishing components are known to the person skilled in the art. There come into consideration, for example, silicates or fluorosilicates, such as those described in DE-OS No. 17 52 163. In addition, it is also possible to use, for example, quartz meal (see DE-AS No. 12 19 764), silica gels or colloidal solutions (see U.S. Pat. No. 3,170,273) or aluminum or gallium hydroxide (see DE-OS No. 26 00 990). The particular mechanical polishing components chosen are applied to the polishing plate in the appropriate prescribed form, that is to say in the form of a gel, a colloidal solution, or a suspension of particles of suitable size.

The suitable concentrations may vary within a wide range both as regards the component that yields free chlorine and as regards the component that yields free carbon dioxide. Advantageously, however, especially in the case of the bleaching liquor/carboxylic acid combination, the concentration of the component that yields free carbon dioxide is made to conform with a certain predetermined concentration of the component that yields free chlorine, in order to ensure that the medium remains acidic during polishing. Thus, for example, by diluting commercially available bleaching liquor (usually approximately 180 g/l NaOCl) it is possible to produce an aqueous solution containing from 10 to 100 g/l, preferably from 50 to 70 g/l, and especially 60 g/l, of bleaching liquor, the solution then being combined, during polishing, with a corresponding amount of a correspondingly concentrated aqueous lactic acid solution containing, in general, from 10 to 100 g/l of lactic acid. An upper limit for the suitable concentration range is determined, for example, by the fact that at higher concentrations the polishing cloth may be attacked.

The process according to the invention is suitable to be carried out in the apparatus now customary for polishing semiconductor wafers. A special advantage lies in the comparatively low corrosive action of the starting materials, which, in addition, are inexpensive and readily obtainable. Consequently, it is now no longer necessary, as it was previously because of the strongly corrosive polishing agent and the rapid wear, to have a polishing apparatus especially for polishing indium phosphide surfaces. On the contrary, it is now possible, without disadvantage, to polish indium phosphide wafers alternately with other semiconductor wafers on the same polishing apparatus.

EXAMPLE 1

In each case, 10 to 15 monocrystalline indium phosphide wafers, each having a surface area of from 10 to 20 cm$^2$ and a thickness of 400 um, were cemented onto stainless steel carrier plates of 340 mm diameter. These plates were introduced into a polishing machine, the polishing plate of which was covered with a hard polishing cloth. During the mechanical polishing operation, which was carried out in a customary manner (pressing pressure approximately 8 to 10 N/cm$^2$; speed of polishing plate approximately 70 rev/min; temperature of the carrier plates approximately 25° C.), an aqueous solution of 60 g/l of bleaching liquor and aqueous solutions of lactic acid in various concentrations were applied to the polishing cloth at an inflow rate of approximately 50 ml/min in each case. After polishing for 30 minutes, the amount of material removed by polishing was measured and the pH of the polishing solution was determined. The values are compiled in Table 1 (concentrations in g/l; removal in um/30 min).

TABLE 1

| Bleaching liquor | Lactic Acid | pH | Removal |
|---|---|---|---|
| 60 | 12.5 | 6.99 | 5 |
| 60 | 25 | 3.31 | 28 |
| 60 | 50 | 2.80 | 24 |
| 60 | 100 | 2.66 | 31 |

The wafers polished close to neutral pH exhibited poor surface properties and appeared blue in places. In contrast, the indium phosphide wafers polished in the acidic pH range had a perfectly polished surface free of scratches, dimples, pits and waves.

EXAMPLE 2

The process was the same as in Example 1 except that an aqueous solution of 60 g/l of bleaching liquor and aqueous solutions of tartaric acid in various concentrations were applied to the polishing cloth. The polishing removal values and pH values measured after polishing for 30 minutes are shown in Table 2 (concentrations in g/l; removal in um/30 min).

TABLE 2

| Bleaching liquor | Tartaric acid | pH | Removal |
|---|---|---|---|
| 60 | 5 | 8.10 | — |
| 60 | 12.5 | 3.70 | 12 |
| 60 | 25 | 2.99 | 15 |
| 60 | 50 | 2.53 | 15 |
| 60 | 100 | 2.19 | 17 |

Once again the wafers polished in an acidic medium exhibited a perfectly polished surface free of scratches, dimples, pits and waves.

EXAMPLE 3

The process was the same as in Examples 1 and 2 except that solutions of 100 g/l of potassium carbonate and of phosphoric acid in various proportions (as listed in Table 3) instead of lactic acid solution were separately applied to the polishing cloth. The polishing removal values measured after polishing for 30 minutes are shown in Table 3 (concentration in g/l; removal in um/30 min).

TABLE 3

| Bleaching Liquor | Potassium Carbonate | Phosphoric Acid | Removal |
|---|---|---|---|
| 60 | 100 | 25 | 3 |
| 60 | 100 | 50 | 5 |
| 60 | 100 | 100 | 10 |
| 60 | 100 | 150 | 12 |
| 60 | 100 | 200 | 12 |

The surfaces of the polished wafers were free of scratches, dimples, pits and waves.

Thus, while only a few examples of the present invention have been shown, it will be obvious to those skilled in the art that other changes and variations can be made in carrying out the present invention without departing from the spirit and scope thereof, as defined in the appended claims.

What is claimed is:

1. A process for polishing indium phosphide surfaces comprising the steps of:
   mechanically polishing an indium phosphide surface; and
   during the mechanical polishing operation, applying to the surface being polished an oxidizing component that yields free chlorine in an aqueous acidic medium and a component that yields free carbon dioxide.

2. The process of claim 1, wherein said oxidizing component that yields free chlorine in an aqueous acidic medium is a member selected from the group consisting of alkali metal hypochlorites.

3. The process of claim 1, wherein sodium hypochlorite is used as said oxidizing component.

4. The process of claim 1, wherein said component that yields carbon dioxide is a member selected from the group consisting of those carboxylic acids which are attacked by the oxidizing component with the evolution of carbon dioxide.

5. The process of claim 1, wherein a carbonate/acid mixture is used as said component that yields free carbon dioxide.

* * * * *